(12) United States Patent
Komada

(10) Patent No.: US 8,659,041 B2
(45) Date of Patent: Feb. 25, 2014

(54) NITRIDE SEMICONDUCTOR LIGHT EMITTING DIODE

(75) Inventor: Satoshi Komada, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 458 days.

(21) Appl. No.: 12/755,926

(22) Filed: Apr. 7, 2010

(65) Prior Publication Data

US 2010/0252844 A1    Oct. 7, 2010

(30) Foreign Application Priority Data

Apr. 7, 2009 (JP) ................................. 2009-093184
Mar. 10, 2010 (JP) ................................. 2010-053475

(51) Int. Cl.
H01L 33/00 (2010.01)

(52) U.S. Cl.
USPC ............... 257/97; 257/13; 257/94; 257/96; 257/E33.016

(58) Field of Classification Search
USPC ............................ 257/94, 13, 96, 97, E33.016
See application file for complete search history.

(56) References Cited

U.S. PATENT DOCUMENTS

| | | | |
|---|---|---|---|
| 5,777,350 A | | 7/1998 | Nakamura et al. |
| 6,309,459 B1* | | 10/2001 | Yuge .............................. 117/105 |
| 7,769,066 B2* | | 8/2010 | Chakraborty et al. ... 372/45.012 |
| 2001/0030318 A1 | | 10/2001 | Nakamura et al. |
| 2002/0074561 A1* | | 6/2002 | Sawaki et al. .................. 257/103 |
| 2002/0167019 A1 | | 11/2002 | Nakamura et al. |
| 2003/0160246 A1* | | 8/2003 | Narayan et al. .................. 257/79 |
| 2004/0119063 A1* | | 6/2004 | Guo et al. ........................ 257/13 |
| 2004/0195562 A1* | | 10/2004 | Munns ............................... 257/1 |
| 2006/0154455 A1* | | 7/2006 | Guo et al. ....................... 438/483 |
| 2007/0063207 A1* | | 3/2007 | Tanizawa et al. ............... 257/94 |
| 2007/0096077 A1 | | 5/2007 | Sanga et al. |
| 2007/0297476 A1* | | 12/2007 | Ito et al. ..................... 372/45.01 |
| 2008/0191195 A1* | | 8/2008 | Tanizawa et al. ............... 257/14 |
| 2009/0194784 A1* | | 8/2009 | Kaji et al. ...................... 257/103 |
| 2009/0272992 A1* | | 11/2009 | Tsutsumi et al. ............... 257/94 |
| 2011/0104843 A1* | | 5/2011 | Jun ................................. 438/45 |

FOREIGN PATENT DOCUMENTS

| | | |
|---|---|---|
| JP | 6-268257 | 9/1994 |
| JP | 10-84132 | 3/1998 |
| JP | 2735057 | 4/1998 |
| JP | 2002-185041 | 6/2002 |
| JP | 2006-60197 | 3/2006 |
| WO | WO-2007/052628 | 5/2007 |
| WO | WO-2008/087930 | 7/2008 |

* cited by examiner

Primary Examiner — Colleen Matthews
Assistant Examiner — William Harriston
(74) Attorney, Agent, or Firm — Morrison & Foerster LLP

(57) ABSTRACT

A nitride semiconductor light emitting diode includes at least an n-type nitride semiconductor layer, an active layer, and a p-type nitride semiconductor layer. The active layer is formed of one first nitride semiconductor layer having a highest In ratio in the light emitting diode. The light emitting diode further includes at least one of a second nitride semiconductor layer located between the active layer and the n-type nitride semiconductor layer and including an InGaN layer, and a third nitride semiconductor layer located between the active layer and the p-type nitride semiconductor layer and including an InGaN layer. Respective In (Indium) ratios of the InGaN layers included in the second nitride semiconductor layer and the InGaN layers included in the third nitride semiconductor layer are lower than the In ratio of the first nitride semiconductor layer forming the active layer. The LED with high luminous efficiency can thus be provided.

9 Claims, 2 Drawing Sheets

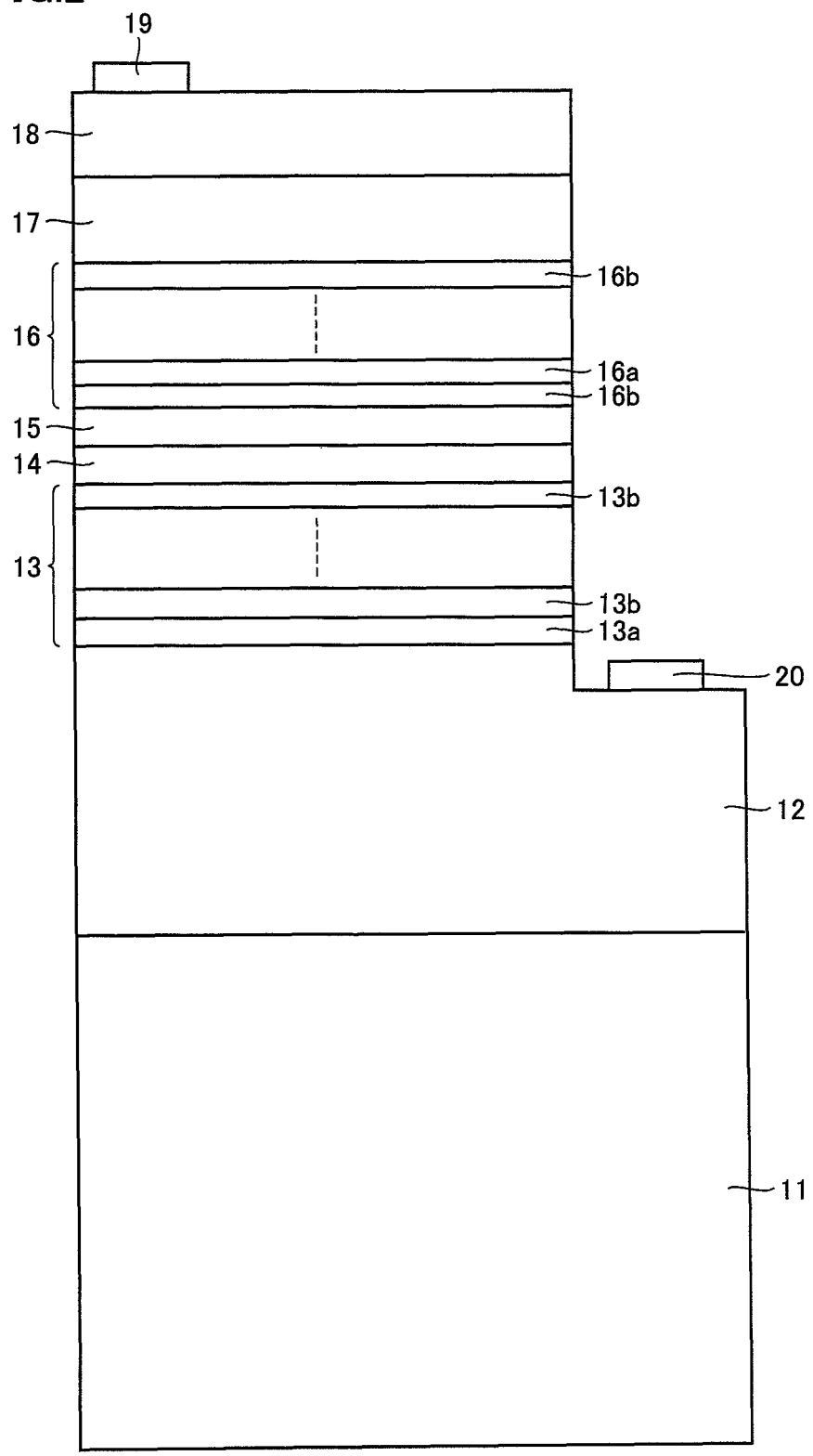

NITRIDE SEMICONDUCTOR LIGHT EMITTING DIODE

This nonprovisional application is based on Japanese Patent Application Nos. 2009-093184 and 2010-053475 filed on Apr. 7, 2009 and Mar. 10, 2010 respectively with the Japan Patent Office, the entire contents of which are hereby incorporated by reference.

BACKGROUND OF THE INVENTION

1. Field of the Invention

The present invention relates to a nitride semiconductor light emitting diode.

2. Description of the Background Art

Japanese Patent Laying-Open No. 06-268257 proposes a structure in which an active layer includes multiple InGaN layers that are different in In (Indium) ratio.

Japanese Patent Laying-Open No. 10-084132 proposes a superlattice structure in which an active layer includes a quantum well layer and a barrier layer.

Japanese Patent Laying-Open No. 2006-060197 proposes a group III nitride semiconductor stack in which heavily doped layers and lightly doped layers are alternately stacked. The heavily doped layers are each a group III nitride semiconductor layer doped with n-type impurities of a relatively higher concentration, and the lightly doped layers are each a group III nitride semiconductor layer doped with n-type impurities of a relatively lower concentration.

As seen from above, conventional light emitting diodes as have been reported generally adopt the technique of the multiple quantum well structure as an active layer structure.

One of the factors of deterioration in luminous efficiency of a light emitting diode is deterioration in light extraction efficiency due to self absorption of an active layer. The structure of the active layer may be, for example, a multiple quantum well structure or single quantum well structure. The multi-quantum well structure is likely to be influenced by the self absorption, due to the fact that well layers in the active layer are different in the fluctuation in mixed crystal or the like as described above. As for the single quantum well structure, while the influence of the self absorption depends on the thickness of the layer, the single quantum well structure is less likely to be influenced by the self absorption. It is difficult, however, for the single quantum well structure to achieve high luminous efficiency as compared with the multi-quantum well structure.

SUMMARY OF THE INVENTION

An object of the present invention is to provide a light emitting diode (LED) with high luminous efficiency, in view of respective disadvantages of the multi-quantum well structure and the single quantum well structure.

The present invention is a nitride semiconductor light emitting diode including at least an n-type nitride semiconductor layer, an active layer, and a p-type nitride semiconductor layer, and further includes at least one of a second nitride semiconductor layer located between the active layer and the n-type nitride semiconductor layer and including an InGaN layer, and a third nitride semiconductor layer located between the active layer and the p-type nitride semiconductor layer and including an InGaN layer. In (Indium) ratios of the InGaN layer included in the second nitride semiconductor layer and the InGaN layer included in the third nitride semiconductor layer are lower than the In ratio of a first nitride semiconductor layer forming the active layer.

Preferably, regarding the nitride semiconductor light emitting diode of the present invention, in at least one of the second nitride semiconductor layer and the third nitride semiconductor layer, not less than two nitride semiconductor layers form a periodic structure. Respective In ratios of the not less than two nitride semiconductor layers are lower than the In ratio of the first nitride semiconductor layer forming the active layer.

Preferably, regarding the nitride semiconductor light emitting diode of the present invention, the second nitride semiconductor layer and the third nitride semiconductor layer each include an InGaN layer having a lower In ratio than the first nitride semiconductor layer forming the active layer.

Preferably, regarding the nitride semiconductor light emitting diode of the present invention, in the second nitride semiconductor layer and the third nitride semiconductor layer each, not less than two nitride semiconductor layers form a periodic structure, and each of the not less than two nitride semiconductor layers includes an InGaN layer having a lower In ratio than the first nitride semiconductor layer forming the active layer.

Preferably, regarding the nitride semiconductor light emitting diode of the present invention, the In ratio of the InGaN layer lower than the In ratio of the first nitride semiconductor layer forming the active layer is not less than 5%.

Preferably, regarding the nitride semiconductor light emitting diode of the present invention, in the second nitride semiconductor layer and the third nitride semiconductor layer each, not less than two nitride semiconductor layers form a periodic structure, and each of the not less than two nitride semiconductor layers forming the periodic structure includes a GaN layer and an InGaN layer.

Preferably, regarding the nitride semiconductor light emitting diode of the present invention, the InGaN layer included in the second nitride semiconductor layer and the InGaN layer included in the third nitride semiconductor layer that have a lower In ratio than the first nitride semiconductor layer forming the active layer are undoped.

Preferably, regarding the nitride semiconductor light emitting diode of the present invention, the InGaN layer included in the second nitride semiconductor layer and having a lower In ratio than the first nitride semiconductor layer forming the active layer is doped with Si and Ge.

Preferably, regarding the nitride semiconductor light emitting diode of the present invention, the GaN layer and the InGaN layer forming the periodic structure are undoped.

Preferably, regarding the nitride semiconductor light emitting diode of the present invention, the GaN layer or the InGaN layer forming the periodic structure of the second nitride semiconductor layer is doped with at least one of Si and Ge.

Preferably, regarding the nitride semiconductor light emitting diode of the present invention, the GaN layer or the InGaN layer forming the periodic structure of the third nitride semiconductor layer is undoped.

Preferably, regarding the nitride semiconductor light emitting diode of the present invention, a layer included in the second nitride semiconductor layer and abutting on the active layer is a GaN layer.

Preferably, regarding the nitride semiconductor light emitting diode of the present invention, a layer included in the third nitride semiconductor layer and abutting on the p-type nitride semiconductor layer is a GaN layer.

The present invention can thus improve the luminous efficiency of a nitride semiconductor light emitting diode or the like.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a schematic cross section of a preferred example of the nitride semiconductor layer structure in accordance with an embodiment of the present invention.

DESCRIPTION OF THE PREFERRED EMBODIMENTS

Figure 1:
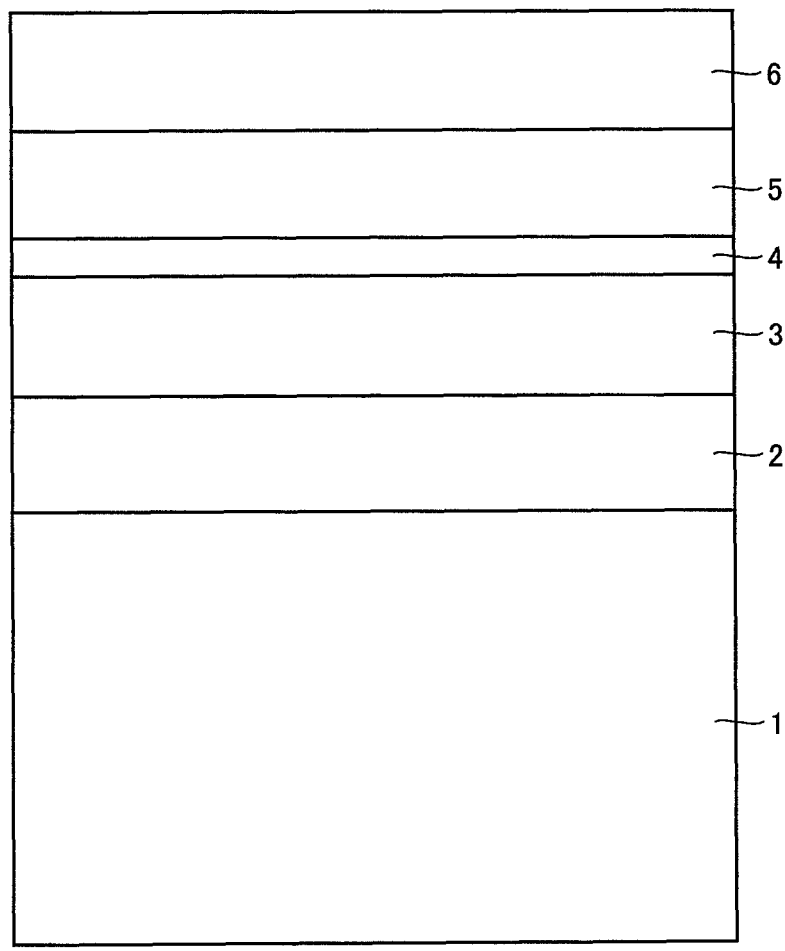
FIG. 1 is a schematic cross section of a preferred example of the nitride semiconductor layer structure, illustrating an example of the nitride semiconductor light emitting device of the present invention.

Embodiments of the present invention will hereinafter be described. In the drawings of the present invention, the same reference characters denote the same or corresponding components.

FIG. 1 shows a schematic cross section of a preferred example of the nitride semiconductor layer structure for illustrating an example of the nitride semiconductor light emitting diode of the present invention. In this nitride semiconductor light emitting diode, at least an n-type nitride semiconductor layer 2, a second nitride semiconductor layer 3, an active layer 4, a third nitride semiconductor layer 5, and a p-type nitride semiconductor layer 6 are formed on a substrate 1.

Substrate

As a material for substrate 1, one of sapphire, SiC, GaN and the like may be selected.

N-Type Nitride Semiconductor Layer

N-type nitride semiconductor layer 2 is formed of $Al_xIn_yGa_{1-x-y}N$ ($0 \leq x \leq 1$, $0 \leq y \leq 1$). A low-temperature buffer layer and/or an undoped layer may be formed in the n-type nitride semiconductor layer. The dopant is selected from Si, Ge and the like.

Second Nitride Semiconductor Layer

On n-type nitride semiconductor layer 2, second nitride semiconductor layer 3 including an InGaN layer is deposited, and then active layer 4 is formed.

In order to ensure high internal quantum efficiency of active layer 4, it is more preferable that a layer included in second nitride semiconductor layer 3 and abutting on active layer 4 is a GaN layer.

In terms of ensured high light extraction efficiency, it is indispensable that the In ratio of the InGaN layer formed in second nitride semiconductor layer 3 is lower than the In ratio of a first nitride semiconductor layer that contains In and forms the active layer. In an exceptional case where the In ratio of the InGaN layer formed in second nitride semiconductor layer 3 is higher than that of the first nitride semiconductor layer which forms the active layer, high light extraction efficiency may still be ensured under the conditions that the thickness of the InGaN layer is smaller than that of the active layer and the band gap between the bottom of the conduction band and the top of the valence band of the InGaN layer is larger than that of the active layer. It should be noted that "In (Indium) ratio" herein refers to the ratio of the number of moles (atoms) of In to the total number of moles (atoms) of group 13 element(s) other than In.

Still more preferably, second nitride semiconductor layer 3 includes two or more nitride semiconductor layers that form a periodic structure, and the two or more nitride semiconductor layers have respective In ratios that are lower than the In ratio of the first nitride semiconductor layer which forms the active layer and are different from each other. Here, respective In ratios of the two or more nitride semiconductor layers may be different in a stepwise manner. Specifically, in terms of ensured high internal quantum efficiency of active layer 4, the periodic structure is preferably formed of GaN and InGaN layers. In this case as well, it is indispensable that the In ratio of the InGaN layer is lower than the In ratio of the first nitride semiconductor layer forming active layer 4, in order to ensure high light extraction efficiency. In an exceptional case where the In ratio of the InGaN layer formed in second nitride semiconductor layer 3 is higher than that of the first nitride semiconductor layer forming the active layer, the high light extraction efficiency may still be ensured under the conditions that the InGaN layer has a smaller thickness and a larger band gap between the bottom of the conduction band and the top of the valence band, as compared with the active layer.

Second nitride semiconductor layer 3 may be an undoped layer or n-type-doped layer. Here, the n-type dopant may be Si, Ge, or the like.

The In ratio of the InGaN layer in second nitride semiconductor layer 3 is preferably 5% or higher in terms of ensured high internal quantum efficiency of active layer 4, and is more preferably 5 to 15%. The In ratio exceeding 15% deteriorates the crystalline property of the InGaN layer, and is therefore not preferred.

As for the n-type dopant, while the effect of the n-type dopant may vary depending on respective In ratios of second nitride semiconductor layer 3 and active layer 4, n-type doping of second nitride semiconductor layer 3 is preferable in that more light can be emitted from a single layer of active layer 4, leakage of carriers can be prevented, and the light extraction efficiency is improved.

Active Layer

Active layer 4 is formed of the first nitride semiconductor layer. Specifically, active layer 4 is formed of an InGaN layer, and the In ratio and the thickness of the InGaN layer may be varied to design a desired wavelength.

The In ratio of the first nitride semiconductor layer is designed to obtain a desired wavelength. In order to ensure high internal quantum efficiency, the InGaN layer forming the first nitride semiconductor layer is preferably undoped.

Third Nitride Semiconductor Layer

Third nitride semiconductor layer 5 includes an InGaN layer. Third nitride semiconductor layer 5 is preferably formed of the InGaN layer and a GaN layer for lessening thermal damage to the active layer during growth of p-type nitride semiconductor layer 6.

A layer included in third nitride semiconductor layer 5 and abutting on p-type nitride semiconductor layer 6 is preferably a GaN layer in terms of ensured high efficiency of injection to the active layer.

Third nitride semiconductor layer 5 may include two or more nitride semiconductor layers forming a periodic structure, and the two or more nitride semiconductor layers may have respective In ratios that are lower than the In ratio of the first nitride semiconductor layer forming the active layer and are different from each other. Here, respective In ratios of the two or more nitride semiconductor layers may be different in a stepwise manner. Preferably, third nitride semiconductor layer 5 is undoped in order to ensure high carrier injection efficiency and prevent diffusion of impurities to the active layer.

The In ratio of the InGaN layer in third nitride semiconductor layer 5 is preferably 5% or higher in terms of ensured high internal quantum efficiency of active layer 4, and is more preferably 5 to 15%. The In ratio exceeding 15% deteriorates the crystalline property of the InGaN layer, and is therefore not preferred.

P-Type Nitride Semiconductor Layer

The p-type dopant of p-type nitride semiconductor layer 6 is selected from Mg and Zn. P-type nitride semiconductor layer 6 includes an AlGaInN layer.

Electrode

Positive and negative electrodes are formed in the following way. In the case of an electrically insulating substrate of sapphire for example, etching is done from p-type nitride semiconductor layer 6 to n-type nitride semiconductor layer 2, so that a positive electrode may be formed on p-type nitride semiconductor layer 6 with a transparent current diffusion layer of, for example, ITO (indium tin oxide), IZO (indium zinc oxide), IGO (indium gallium oxide), $SnO_2$ or the like, interposed between p-type nitride semiconductor layer 6 and the positive electrode, and a negative electrode may be formed on n-type nitride semiconductor layer 2 as exposed.

In the case of an electrically conductive substrate of GaN, SiC or the like, a positive electrode may be formed on p-type nitride semiconductor layer 6 with a current diffusion layer of, for example, ITO, IZO, IGO, $SnO_2$ or the like interposed between the p-type nitride semiconductor layer 6 and the positive electrode, and a negative electrode may be formed on the rear surface of substrate 1.

Preferred Embodiments 1 to 6 of the present invention will now be described with reference to FIG. 2. Respective compositions of Embodiments 1 to 6 are shown in Table 1.

Formation of N-Type Nitride Semiconductor Layer

Next, the temperature of substrate 11 is lowered to 510° C. Hydrogen serving as a carrier gas, and ammonia and TMG (trimethylgallium) serving as material gases are caused to flow in the reaction furnace. Accordingly, a buffer layer of GaN is deposited on the surface (c plane) of substrate 11 to a thickness of approximately 20 nm by means of the MOCVD method.

Then, the temperature of substrate 11 is raised to 1050° C. Hydrogen serving as a carrier gas, ammonia and TMG serving as material gases, and silane serving as an impurity gas are caused to flow in the reaction furnace. Accordingly, an n-type nitride semiconductor base layer of GaN doped with Si (carrier concentration: $1\times10^{18}/cm^3$) is deposited on the buffer layer to a thickness of 6 μm by means of the MOCVD method.

Subsequently, an n-type nitride semiconductor contact layer of GaN is deposited on the n-type nitride semiconductor base layer to a thickness of 0.5 μm by means of the MOCVD method in a similar manner to the n-type nitride semiconductor base layer, except that doping with Si is done so that the carrier concentration is $5\times10^{18}/cm^3$.

The buffer layer, the n-type nitride semiconductor base layer, and the n-type nitride semiconductor contact layer form an n-type nitride semiconductor layer 12.

Formation of Second Nitride Semiconductor Layer

Next, the temperature of substrate 11 is lowered to 730° C. Nitrogen serving as a carrier gas, and ammonia, TMG and TMI (trimethylindium) serving as material gases are caused to flow in the reaction furnace. Accordingly, a second-nitride-semiconductor primary layer 13a of $In_{0.13}Ga_{0.87}N$ with a

TABLE 1

| | | Embodiment 1 | Embodiment 2 | Embodiment 3 | Embodiment 4 | Embodiment 5 | Embodiment 6 |
|---|---|---|---|---|---|---|---|
| 18: light transmissive electrode | | ITO | ITO | ITO | ITO | ITO | ITO |
| 17: p-type nitride semiconductor layer | p-type nitride semiconductor contact layer | GaN | GaN | GaN | GaN | GaN | GaN |
| | p-type nitride semiconductor cladding layer | AlGaN | AlGaN | AlGaN | AlGaN | AlGaN | AlGaN |
| 16: third nitride semiconductor layer | 16b: nitride semiconductor secondary layer | GaN | — | GaN | GaN | GaN | GaN |
| | 16a: nitride semiconductor primary layer | $In_{0.13}Ga_{0.87}N$ | — | $In_{0.13}Ga_{0.87}N$ | $In_{0.13}Ga_{0.87}N$ | $In_{0.13}Ga_{0.87}N$ | $In_{0.13}Ga_{0.87}N$ |
| | 16b: nitride semiconductor secondary layer | GaN | — | GaN | GaN | GaN | GaN |
| | periodic structure | 2 cycles | — | 2 cycles | 2 cycles | 2 cycles | 1 cycle |
| 15: anti-evaporation layer | | GaN | GaN | GaN | GaN | GaN | GaN |
| 14: active layer (first nitride semiconductor layer) | | $In_{0.2}Ga_{0.8}N$ | $In_{0.2}Ga_{0.8}N$ | $In_{0.2}Ga_{0.8}N$ | $In_{0.2}Ga_{0.8}N$ | $In_{0.2}Ga_{0.8}N$ | $In_{0.2}Ga_{0.8}N$ |
| 13: second nitride semiconductor layer | 13b: nitride semiconductor secondary layer | GaN | GaN | — | GaN (Si-doped) | GaN | GaN |
| | 13a: nitride semiconductor primary layer | $In_{0.13}Ga_{0.87}N$ | $In_{0.07}Ga_{0.93}N$ | — | $In_{0.13}Ga_{0.87}N$ | $In_{0.13}Ga_{0.87}N$ | $In_{0.13}Ga_{0.87}N$ |
| | periodic structure | 3 cycles | 3 cycles | — | 3 cycles | 1 cycle | 3 cycles |
| 12: n-type nitride semiconductor layer | n-type nitride semiconductor contact layer | GaN | GaN | GaN | GaN | GaN | GaN |
| | n-type nitride semiconductor base layer | GaN | GaN | GaN | GaN | GaN | GaN |
| | buffer layer | GaN | GaN | GaN | GaN | GaN | GaN |
| 11: substrate | | sapphire | sapphire | sapphire | sapphire | sapphire | sapphire |

Embodiment 1

For Embodiment 1, a nitride semiconductor light emitting diode device having the structure as shown in FIG. 2 is produced. First, a substrate 11 of sapphire is prepared, and substrate 11 is set in a reaction furnace of an MOCVD (Metal Organic Chemical Vapor Deposition) apparatus. Then, while hydrogen is caused to flow in the reaction furnace, the temperature of substrate 11 is raised to 1050° C., and the surface (c plane) of substrate 11 is cleaned.

thickness of 2.5 nm is formed on the n-type nitride semiconductor contact layer. Subsequently, supply of TMI is stopped to form a second-nitride-semiconductor secondary layer 13b of GaN with a thickness of 7 nm. Here, a set of the primary layer and the secondary layer is a basic cycle of a periodic structure. The layers of three cycles are grown to form a second nitride semiconductor layer 13.

Formation of Active Layer

Subsequently, the temperature of substrate 11 is lowered to 700° C. Nitrogen serving as a carrier gas, and ammonia, TMG and TMI serving as material gases are caused to flow in the reaction furnace. Accordingly, an active layer 14 of $In_{0.20}Ga_{0.80}N$ with a thickness of 2.5 nm is grown on second-nitride-semiconductor secondary layer 13b.

Formation of Anti-Evaporation Layer

Subsequently, with the temperature of substrate 11 remaining at 700° C., supply of TMI is stopped. Accordingly, on active layer 14, an anti-evaporation layer 15 of GaN with a thickness of 2 nm is formed.

Formation of Third Nitride Semiconductor Layer

Subsequently, the temperature of substrate 11 is raised to 730° C. Nitrogen serving as a carrier gas, and ammonia and TMG serving as material gases are caused to flow in the reaction furnace. Accordingly, a third-nitride-semiconductor secondary layer 16b of GaN with a thickness of 7 nm is grown. After this, TMI is additionally supplied to grow a third-nitride-semiconductor primary layer 16a of $In_{0.13}Ga_{0.87}N$ with a thickness of 2.5 nm. Here, a set of the secondary layer and the primary layer is a basic cycle of a periodic structure. The layers of two cycles are grown on anti-evaporation layer 15. Further, a third-nitride-semiconductor secondary layer 16b of GaN with a thickness of 7 nm is grown on the periodic structure. In this way, a third nitride semiconductor layer 16 is formed.

Formation of P-Type Nitride Semiconductor Layer

Then, the temperature of substrate 11 is raised to 950° C. Hydrogen serving as a carrier gas, ammonia, TMG and TMA (trimethylaluminum) serving as material gases, and CP2Mg serving as an impurity gas are caused to flow in the reaction furnace. Accordingly, a p-type nitride semiconductor cladding layer of $Al_{0.20}Ga_{0.85}N$ doped with Mg of a concentration of $1 \times 10^{20}/cm^3$ is deposited by the MOCVD method on third nitride semiconductor layer 16 to a thickness of approximately 20 nm.

Next, the temperature of substrate 11 is kept at 950° C., and hydrogen serving as a carrier gas, ammonia and TMG serving as material gases, and CP2Mg serving as an impurity gas are caused to flow in the reaction furnace. Accordingly, a p-type nitride semiconductor contact layer of GaN doped with Mg of a concentration of $1 \times 10^{20}/cm^3$ is deposited by the MOCVD method on the p-type nitride semiconductor cladding layer to a thickness of 80 nm.

The p-type nitride semiconductor cladding layer and the p-type nitride semiconductor contact layer constitute a p-type nitride semiconductor layer 17.

Next, the temperature of substrate 11 is lowered to 700° C., and nitrogen serving as a carrier gas is caused to flow in the reaction furnace so that annealing is performed.

Formation of Electrode

Next, the wafer is removed from the reaction furnace. On the surface of p-type nitride semiconductor layer 17 that is the topmost layer, a light transmissive electrode 18 of ITO is formed by means of the EB (electron beam) vapor deposition to a thickness of 100 nm. On light transmissive electrode 18, a mask patterned in a predetermined shape is formed. An RIE (Reaction Ion Etching) apparatus is used to perform etching from light transmissive electrode 18 side to expose a surface of the n-type nitride semiconductor contact layer. Pad electrodes 19 and 20 containing Ti and Al respectively are formed at respective predetermined positions on light transmissive electrode 18 and the exposed n-type nitride semiconductor contact layer. In this way, an LED device is produced.

Performance

Regarding the characteristics of this LED device, electroluminescent light emission is chiefly obtained from active layer 14. Other InGaN layers each have a lower In ratio and a wider band gap than active layer 14. Thus, as compared an MQW (Multi Quantum Well) formed so that InGaN layers have the same composition, less self absorption, higher light extraction efficiency, and improved luminous efficiency can be achieved. Further, since the InGaN layers are formed respectively in the second nitride semiconductor layer located on the n-type nitride semiconductor layer side with respect to active layer 14, and in the third nitride semiconductor layer located on the p-type nitride semiconductor layer side with respect to active layer 14, the LED device with higher luminous efficiency than an SQW (Single Quantum Well) can be obtained. Regardless of whether the periodic structure of the third nitride semiconductor layer on the p-type nitride semiconductor layer side includes one cycle or two cycles of the primary and secondary layers, light is chiefly emitted from active layer 14 and high luminous efficiency can be achieved for the above-described reasons.

Embodiment 2

Embodiment 2 is similar to Embodiment 1 except that second nitride semiconductor layer 13 is different from Embodiment 1 and that third nitride semiconductor layer 16 is not formed.

After growth of n-type nitride semiconductor layer 12, the temperature of substrate 11 is lowered to 770° C., and nitrogen serving as a carrier gas, and ammonia, TMG and TMI serving as material gases are caused to flow in the reaction furnace. Accordingly, on the n-type nitride semiconductor contact layer, second-nitride-semiconductor primary layer 13a of $In_{0.07}Ga_{0.93}N$ with a thickness of 2.5 nm is formed. Subsequently, supply of TMI is stopped to form second-nitride-semiconductor secondary layer 13b of GaN with a thickness of 7 nm. Here, a set of the primary layer and the secondary layer is one cycle of a periodic structure. The layers of three cycles are grown to form second nitride semiconductor layer 13.

Subsequently, the temperature of substrate 11 is lowered to 700° C., and nitrogen serving as a carrier gas, and ammonia, TMG and TMI serving as material gases are caused to flow in the reaction furnace. Accordingly, on second-nitride-semiconductor secondary layer 13b, active layer 14 of $In_{0.20}Ga_{0.80}N$ with a thickness of 2.5 nm is grown.

Subsequently, with the temperature of substrate 11 remaining at 700° C., supply of TMI is stopped to grow anti-evaporation layer 15 of GaN with a thickness of 10 nm on active layer 14. After this, p-type nitride semiconductor layer 17 is formed.

The resultant LED device chiefly emits light from active layer 14, and can achieve high light extraction efficiency like Embodiment 1.

Embodiment 3

Embodiment 3 is similar to Embodiment 1 except that second nitride semiconductor layer 13 is not formed.

The resultant LED device chiefly emits light from active layer 14. The LED device can achieve high light extraction efficiency like Embodiment 1.

Embodiment 4

Embodiment 4 is similar to Embodiment 1 except that second-nitride-semiconductor secondary layer 13b in second nitride semiconductor layer 13 is doped.

After growth of n-type nitride semiconductor layer 12, the temperature of substrate 11 is lowered to 730° C., and nitrogen serving as a carrier gas, and ammonia, TMG and TMI serving as material gases are caused to flow in the reaction furnace. Accordingly, on the n-type nitride semiconductor contact layer, second-nitride-semiconductor primary layer 13a of $In_{0.13}Ga_{0.87}N$ with a thickness of 2.5 nm is formed. Subsequently, supply of TMI is stopped and SiH4 (silane) is additionally supplied so that the Si doping concentration is $5\times10^{18}/cm^3$. Accordingly, second-nitride-semiconductor secondary layer 13b of GaN with a thickness of 7 nm is formed. Here, a set of the primary and secondary layers is one cycle of a periodic structure. The layers of three cycles are grown to form second nitride semiconductor layer 13. After this, active layer 14, anti-evaporation layer 15, third nitride semiconductor layer 16, and p-type nitride semiconductor layer 17 are formed.

The resultant LED device chiefly emits light from active layer 14. The LED device can achieve high light extraction efficiency like Embodiment 1.

Embodiment 5

Embodiment 5 is similar to Embodiment 1 except that the number of cycles in the periodic structure of second nitride semiconductor layer 13 is changed to one cycle.

After growth of n-type nitride semiconductor layer 12, the temperature of substrate 11 is lowered to 730° C., and nitrogen serving as a carrier gas, and ammonia, TMG and TMI serving as material gases are caused to flow in the reaction furnace to form, on the n-type nitride semiconductor contact layer, second-nitride-semiconductor primary layer 13a of $In_{0.13}Ga_{0.87}N$ with a thickness of 2.5 nm. Subsequently, supply of TMI is stopped to form second-nitride-semiconductor secondary layer 13b of GaN with a thickness of 7 nm. After this, active layer 14, anti-evaporation layer 15, third nitride semiconductor layer 16, and p-type nitride semiconductor layer 17 are formed.

The resultant LED device chiefly emits light from active layer 14. The LED device can achieve high light extraction efficiency like Embodiment 1.

Embodiment 6

Embodiment 6 is similar to Embodiment 1 except for the number of cycles of the periodic structure of third nitride semiconductor layer 16.

After growth of n-type nitride semiconductor layer 12, second nitride semiconductor layer 13, active layer 14, and anti-evaporation layer 15, the temperature of substrate 11 is raised to 730° C., and nitrogen serving as a carrier gas, and ammonia and TMG serving as material gases are caused to flow in the reaction furnace to grow third-nitride-semiconductor secondary layer 16b of GaN with a thickness of 7 nm. After this, TMI is additionally supplied to grow third-nitride-semiconductor primary layer 16a of $In_{0.13}Ga_{0.87}N$ with a thickness of 2.5 nm. Further, on this primary layer, third-nitride-semiconductor secondary layer 16b of GaN with a thickness of 7 nm is grown to form third nitride semiconductor layer 16. After this, p-type nitride semiconductor layer 17 is formed.

The resultant LED device chiefly emits light from active layer 14. The LED device can achieve high light extraction efficiency like Embodiment 1.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A nitride semiconductor light emitting diode comprising at least an n-type nitride semiconductor layer, an active layer, and a p-type nitride semiconductor layer, wherein
    said active layer is formed of one first nitride semiconductor layer having a highest In (Indium) ratio in said nitride semiconductor light emitting diode,
    said nitride semiconductor light emitting diode further comprises at least one of a second nitride semiconductor layer located between said active layer and said n-type nitride semiconductor layer and including an InGaN layer, and a third nitride semiconductor layer located between said active layer and said p-type nitride semiconductor layer and including an InGaN layer,
    respective In ratios of the InGaN layer included in said second nitride semiconductor layer and the InGaN layer included in said third nitride semiconductor layer are lower than the In ratio of the first nitride semiconductor layer forming said active layer,
    in each of said second nitride semiconductor layer and said third nitride semiconductor layer, not less than two nitride semiconductor layers form a periodic structure,
    respective In ratios of said not less than two nitride semiconductor layers are lower than the In ratio of the first nitride semiconductor layer forming said active layer,
    each of said not less than two nitride semiconductor layers forming said periodic structure includes a GaN layer and an InGaN layer, and
    the GaN layer or the InGaN layer forming the periodic structure of said second nitride semiconductor layer is doped with at least one of Si and Ge.

2. The nitride semiconductor light emitting diode according to claim 1, wherein
    said second nitride semiconductor layer and said third nitride semiconductor layer each include an InGaN layer having a lower In ratio than the first nitride semiconductor layer forming the active layer.

3. The nitride semiconductor light emitting diode according to claim 1, wherein
    each of said not less than two nitride semiconductor layers includes an InGaN layer having a lower In ratio than the first nitride semiconductor layer forming said active layer.

4. The nitride semiconductor light emitting diode according to claim 1, wherein
    the In ratio of the InGaN layer lower than the In ratio of the first nitride semiconductor layer forming said active layer is not less than 5%.

5. The nitride semiconductor light emitting diode according to claim 1, wherein
    the InGaN layer included in said second nitride semiconductor layer and the InGaN layer included in said third nitride semiconductor layer that have a lower In ratio than the first nitride semiconductor layer forming said active layer are undoped.

6. The nitride semiconductor light emitting diode according to claim 1, wherein
    the InGaN layer included in said second nitride semiconductor layer and having a lower In ratio than the first nitride semiconductor layer forming said active layer is doped with Si and Ge.

7. The nitride semiconductor light emitting diode according to claim 1, wherein the GaN layer or the InGaN layer forming the periodic structure of said third nitride semiconductor layer is undoped.

8. The nitride semiconductor light emitting diode according to claim 1, wherein
a layer included in said second nitride semiconductor layer and abutting on said active layer is a GaN layer.

9. The nitride semiconductor light emitting diode according to claim 1, wherein
a layer included in said third nitride semiconductor layer and abutting on said p-type nitride semiconductor layer is a GaN layer.

* * * * *